United States Patent [19]
Cooper

[11] 4,213,091
[45] Jul. 15, 1980

[54] METHOD AND APPARATUS FOR TESTING A MAGNETIC DOMAIN DEVICE

[75] Inventor: Paul V. Cooper, Kingsley, England

[73] Assignee: Plessey Handel und Investments AG, Zug, Switzerland

[21] Appl. No.: 906,623

[22] Filed: May 16, 1978

[30] Foreign Application Priority Data

May 21, 1977 [GB] United Kingdom ............... 21503/77

[51] Int. Cl.² ........................................... G01R 33/12
[52] U.S. Cl. ..................................... 324/210; 365/1; 365/2
[58] Field of Search ................... 324/210, 212; 365/1, 365/2, 27, 28

[56] References Cited
U.S. PATENT DOCUMENTS

| 3,836,896 | 9/1974 | Rifkin | 365/1 |
| 3,931,618 | 1/1976 | Lacey | 365/1 |

OTHER PUBLICATIONS

Terlep, K.; Dynamically Tuning the Bias Field of Magnetic Bubble Modules, IBM Tech. Bull., vol. 16, No. 11, Apr. 1974, pp. 3692–3693.

Primary Examiner—Siegfried H. Grimm
Assistant Examiner—Walter E. Snow
Attorney, Agent, or Firm—Fleit & Jacobson

[57] ABSTRACT

A method of testing a magnetic bubble device which includes an integral magnetic shield is provided for setting the magnetization of the bias field thereof, in which a leakage magnetic field is induced in the shield of the device which is superimposed on the usual bias magnetic field for changing its magnetization.

7 Claims, 2 Drawing Figures

METHOD AND APPARATUS FOR TESTING A MAGNETIC DOMAIN DEVICE

This invention relates to magnetic domain devices commonly referred to as magnetic bubble devices.

Present day magnetic bubble devices are normally provided with an internal magnet structure usually in the form of a pair of spaced magnets which are used to produce the required bias field—commonly referred to as the Z field—for the device chip. The device will usually operate over a range of bias fields—commonly referred to as its bias field margin—and it is desirable to set the magnetic field afforded by the bias field magnets so that the device operates at or near the centre of its bias field margin. In devices that are packaged in unshielded packages this is easily achieved by operating the device under test conditions and monitoring its error rate in some way, and by superimposing a test field on to the magnetic field provided by the bias field magnets so that the bias field may be effectively varied to determine the operating point of the device relative to its bias field margin. If the operating point is not centrally disposed a setting pulse is applied to the device which increases or decreases the field strength of the bias field magnets and the test is repeated.

However, it is becoming increasingly popular to provide devices with an integral magnetic shield which results in the device being less affected by external magnetic fields, but the provision of the shield means that when an external magnetic field which is large enough to be effective is applied to the device for determining the bias field margin, the relationship between the actual field seen by the device chip and the applied field is non-linear due to the saturation effects of the shield. This effect of the shield is overcome in prior art devices by either providing 'Z' coils in the device package inside the shield which is undesirable on cost, size and weight grounds and also required extra electrical connection to be made to the device or by providing slots in the device within the device shield to enable a Z coil to be inserted. However difficulties arise in such devices in providing the slots which may also result in the device being of increased size.

The present invention relates to a method of testing and test apparatus which permit the bias field margin in shielded magnetic domain devices to be determined without the disadvantages of the prior art systems and which additionally enables the magnetisation of the bias field magnet or magnets in such devices to be set.

According to one aspect of the present invention there is provided a method of testing a magnetic domain device provided with an integral magnetic shield for setting purposes in which a leakage magnetic field is induced in the shield of said device which is superimposed on the usual bias magnetic field thereof for changing the effective magnetisation thereof.

In carrying out the method of testing the leakage magnetic field may be varied to determine the bias field margin of said device and the method may include the step of setting the bias magnetic field of said device so that it operates substantially in the centre thereof.

According to another aspect of the present invention there is provided test apparatus for carrying out the method of testing according to the said one aspect of the present invention, the test apparatus comprising magnetising means for inducing a leakage magnetic field in the shield of said device and in a preferred apparatus the magnetising means will comprise a generally 'W' shaped magnetisable core, the two outer limbs of which co-act with opposed sides of the shield of said device to cause leakage magnetic fields to be induced in said sides.

In one apparatus in accordance with the said another aspect of the present invention, pulse setting means may be provided for setting the bias magnetic field of said device and this may comprise one pulse setting coil positioned on the centre limb of said magnetisable core and a further pulse setting coil positioned on the centre limb of an auxiliary substantially 'W' shaped magnetisable core which is positioned relative to the said core such that said device is sandwiched therebetween.

The test apparatus according to the said another aspect of the invention may also be provided with connector means for making electrical connection to the connecting leads of said device to enable it to operate whilst being tested.

These and other features of the invention will now be described in greater detail by considering an exemplary embodiment of the invention which is described with reference to the accompanying drawing in which.

Figure 1:
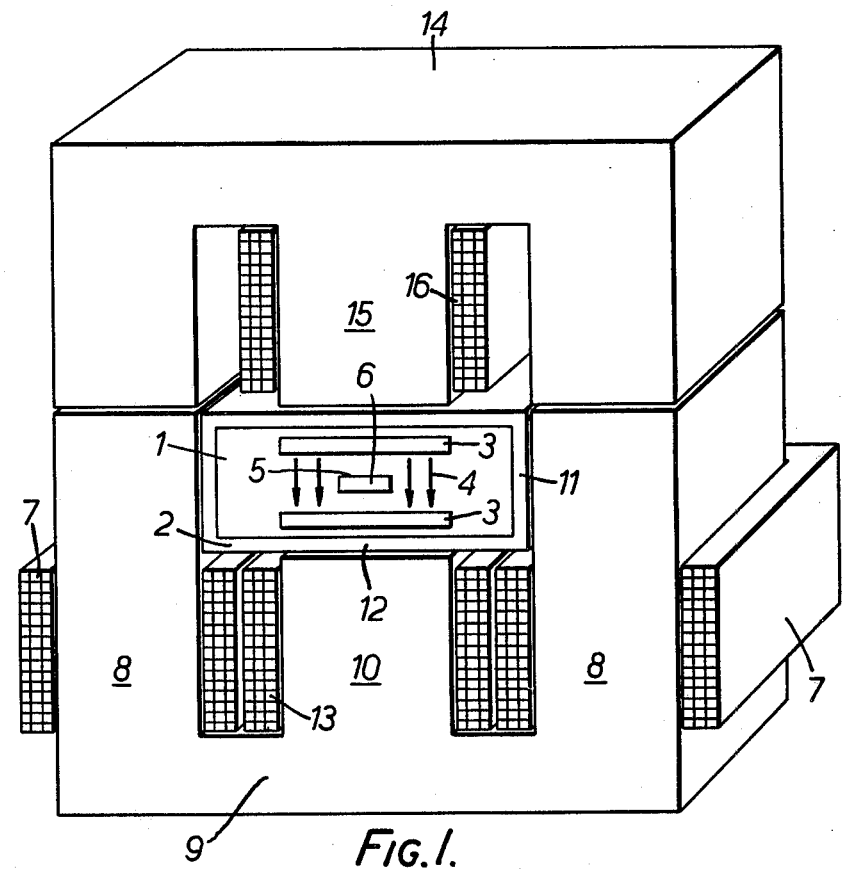
FIG. 1, depicts test apparatus in accordance with the present invention.

The superimposing of a test field on to the normal bias magnetic field of a shielded magnetic bubble device is achieved in accordance with the present invention by coupling the device shield to an externally generated magnetic field so that it is driven in a leakage mode, the leakage field being superimposed on to the internally generated bias magnetic field so as to change its effective field strength. Considering the test apparatus shown in FIG. 1 of the drawing, a bubble memory device 1 is diagrammatically shown in end view, for the sake of clarity without its connecting leads, the device 1 including a tubular magnetic shield 2 and inside the shield 2 a pair of magnets 3 which produce a bias magnetic field 4 which is generally perpendicular to the active surface 5 of a device chip 6. It is necessary, in order to achieve optimum performance, to set the field strength of the magnets 3 so that the device chip 6 operates at or near the centre of its bias field margin and to do this it is necessary to superimpose an externally generated test magnetic field on to the bias magnetic field 4 afforded by the magnets 3 so that this may be varied to determine the limits of the bias field margin relative to the normal operating point determined by the bias magnets 3. In the test apparatus shown in the drawing, the test field that is superimposed on the bias magnetic field 4 is derived by means of two offset coils 7 which are provided around the outer limbs 8 of a generally 'W' shaped ferrite core 9, the outer limbs 8 of the ferrite core 9 being extended relative to the centre limb 10 of the core 9 and spaced apart so as to provide a recess for the bubble memory device 1, the limbs 8 of the ferrite core 9 lying closely adjacent respective opposed sides 11 of the shield 2 and the upper surface of the limb 10 being closely adjacent to the lower portion 12 (as viewed in FIG. 1 of the drawing) of the shield 2. The coils 7 provided around the limbs 8 of the ferrite core 9 are both energised so as to cause the resulting magnetic fields to be additive in the centre limb 10 of the ferrite core 9 and due to the close proximity of the extended parts of the limbs 8 with the sides 11 of the shield 2, a leakage field is set up in the two sides 11 of the shield 2 which is superimposed onto the bias field 4 afforded by the magnets 3. Because the shield 2 is driven in a leakage mode and not into saturation, the relationship between the magnetic field seen by the device chip 6 and the externally generated magnetic field is substantially linear. By varying the excitation of the coils 7 the magnitude and direction of the test field superimposed on to the bias magnetic field may be varied to determine the bias field margin in the usual way. If after determining the bias field margin it is found that the device chip is not operating centrally of it, it is necessary to apply a setting pulse to the bias magnets 3 in order to change their magnetisation to centralise the operating point.

This may be achieved in the test apparatus shown in FIG. 1 of the drawing, by providing a pulse setting coil 13 around the centre limb 10 of the ferrite core 9 and by providing a further 'W' shaped ferrite core 14 which is positioned above the ferrite core 9 so as to sandwich the device 1 therebetween, around the centre limb 15 of which is positioned a further pulse setting coil 16. By suitably energising the pulse setting coils 13 and 16 the magnetisation of the bias magnets 3 may be changed.

Figure 2:
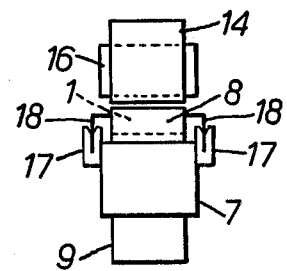
FIG. 2 is a side view of the test apparatus of FIG. 1, modified so as to enable electrical connection to be made to the magnetic bubble device being tested.

It is envisaged that when dual in-line packages are used the test apparatus shown in FIG. 1 of the drawing will be provided with electrical connectors 17 on both sides thereof as shown in the side view of FIG. 2, the electrical connectors 17 enabling electrical contact to be made to the connecting leads 18 of the magnetic bubble device 1 as the device is inserted in the test apparatus so enabling it to be operated whilst under test. It will be appreciated that various modifications may be made to the test apparatus shown without departing from the spirit of the invention which is to drive the shield of a magnetic domain device in a leakage mode in order to obtain the required test field superimposed on the normally provided bias magnetic field. For example, the pulse setting coils 13 and 16 of FIG. 1 and/or the electrical connectors 17 of FIG. 2 may be dispensed with.

What we claim is:

1. A method of testing a magnetic domain device to determine whether the device operates at the centre of a preselected range of bias magnetic field strengths, the device having a substrate for supporting magnetic domains, bias field means for providing the bias magnetic field substantially normal to the substrate and a magnetic shield surrounding the substrate and the bias field means, the method including the steps of: applying an external magnetic field to opposed sides of the shield, which are substantially parallel to the bias field, to provide a magnetic field within the shield, which superimposes linearly on said bias magnetic field without saturating the shield; and monitoring the operation of the device whilst adjusting the value of said external field to determine whether said bias field is set to said centre of the preselected range of bias magnetic field strengths.

2. A method as claimed in claim 1 including the step of setting the bias magnetic field of said device so that it operates substantially in the centre of the bias field margin.

3. Test apparatus for testing a magnetic domain device to determine whether the device operates at the centre of a preselected range of bias magnetic field strengths, the device having a substrate for supporting magnetic domains, bias field means for providing the bias magnetic field substantially normal to the substrate and a magnetic shield surrounding the substrate and the bias field means, the test apparatus including: means for applying an external magnetic field to opposed sides of the shield, which are substantially parallel to the bias field, to provide a magnetic field within the shield which superimposes linearly on said bias magnetic field without saturating the shield; and means for adjusting the magnitude of the applied external magnetic field.

4. Apparatus as claimed in claim 3 in which the magnetising means comprises a generally 'W' shaped magnetisable core, the two outer limbs of which co-act with opposed sides of the shield of said device to cause magnetic fields to be induced in said sides.

5. Apparatus as claimed in claim 3 or 5 including pulse setting means provided for setting the bias magnetic field of said device.

6. Apparatus as claimed in claim 4 further comprising pulse setting means for setting the bias magnetic field of said device, which comprise one pulse setting coil positioned on the centre limb of said magnetisable core and a further pulse setting coil positioned on the centre limb of an auxiliary substantially "W" shaped magnetisable core which is positioned relative to the said core such that the said device is sandwiched there between.

7. Apparatus as claimed in claim 3 including connector means for making electrical connection to the connecting leads of said device to enable it to operate whilst being tested.

* * * * *